US006924757B2

(12) United States Patent
Adams et al.

(10) Patent No.: US 6,924,757 B2
(45) Date of Patent: Aug. 2, 2005

(54) SIGMA-DELTA MODULATOR WITH REDUCED SWITCHING RATE FOR USE IN CLASS-D AMPLIFICATION

(75) Inventors: Robert W. Adams, Acton, MA (US); David Hossack, Cambridge, MA (US); Eric Gaalaas, Bedford, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/851,400

(22) Filed: May 21, 2004

(65) Prior Publication Data

US 2005/0012649 A1 Jan. 20, 2005

Related U.S. Application Data

(60) Provisional application No. 60/472,183, filed on May 21, 2003, and provisional application No. 60/477,067, filed on Jun. 9, 2003.

(51) Int. Cl.[7] .................................... H03M 3/00

(52) U.S. Cl. ......................... 341/143; 341/155

(58) Field of Search ..................... 375/247, 350, 375/376; 341/143, 155

(56) References Cited

U.S. PATENT DOCUMENTS 5,392,040 A * 2/1995 Hayashi ..................... 341/143
5,420,892 A * 5/1995 Okamoto .................... 375/350
5,727,038 A * 3/1998 May et al. .................. 375/376
5,974,089 A * 10/1999 Tripathi et al. ............ 375/247
6,420,987 B1 7/2002 Schoner et al. ............ 341/143

FOREIGN PATENT DOCUMENTS

EP 0759384 2/1997

OTHER PUBLICATIONS

"Flash ADC for Variable Hysteresis Scheme, with Minimal # of Comparators," Gaalaas. *Ideas to Minimize # Comparators, in variable hysteresis scheme*. May 30, 2003.

"The Effect of Hysteresis in the Quantiser of Second Order Sigma–Delta Modulators," Farrell et al.. *Proceedings of the 1997 European Conference on Circuit Theory and Design*. vol. 3, pp. 1468–1473 (Aug. 31, 1997).

* cited by examiner

*Primary Examiner*—Jean Bruner Jeanglaude
(74) *Attorney, Agent, or Firm*—Gauthier & Connors LLP

(57) ABSTRACT

A sigma delta modulator includes a modulator module that includes a quantizer with variable hysteresis, which receives an input signal to perform necessary modulation operations. A non-linear mapping module receives a signal associated with said input signal and tabulates the necessary hysteresis control information so as to reduce the transition rate of the modulator module.

24 Claims, 13 Drawing Sheets

Seventh Order Loop filter

Feedback Coefficients

```
a_coeff[ 0 ] = 1/16
a_coeff[ 1 ] = 1/16 + 1/128
a_coeff[ 2 ] = 1/16 - 1/64
a_coeff[ 3 ] = 1/16 + 1/128
a_coeff[ 4 ] = 1/16 - 1/64
a_coeff[ 5 ] = 1/16 + 1/128
a_coeff[ 6 ] = 1/32 + 1/128
```

Feed-in Coefficients

```
b_coeff[ 0 ] = 1/16
b_coeff[ 1 ] = 1/16 + 1/128
b_coeff[ 2 ] = 1/16 - 1/64
b_coeff[ 3 ] = 1/16 + 1/128
b_coeff[ 4 ] = 1/16 - 1/64
b_coeff[ 5 ] = 1/16 + 1/128
b_coeff[ 6 ] = 1/32 + 1/128
b_coeff[ 7 ] = 1/8
```

Integrator Gains

```
c_coeff[0] = 1.0/128.0;
c_coeff[1] = 1.0/128.0;
c_coeff[2] = 1.0/32.0;
c_coeff[3] = 1.0/64.0;
c_coeff[4] = 1.0/16.0;
c_coeff[5] = 1.0/32.0;
```

Resonator Coefficients

Note, tapped off before integrator gains are applied

```
c_coeff[6] = 2.0;

g_coeff[ 0 ] = 1/256
g_coeff[ 1 ] = 1/128+1/512
g_coeff[ 2 ] = 1/256
```

FIG. 6

| Input MIN | Input MAX | Hystersis |
|---|---|---|
| 0 | 0.125 | 149 / 512 |
| 0.125 | 0.25 | 149 / 512 |
| 0.25 | 0.375 | 149 / 512 |
| 0.375 | 0.5 | 122 / 512 |
| 0.5 | 0.625 | 96 / 512 |
| 0.625 | 0.75 | 55 / 512 |
| 0.75 | 0.875 | 23 / 512 |
| 0.875 | 1.0 | 0 |

FIG. 7

| Input MIN | Input MAX | Code0 (Dither = 0) | Code1 (Dither = 1) |
|---|---|---|---|
| 0 | 0.125 | 149 / 512 | 111 / 512 |
| 0.125 | 0.25 | 149 / 512 | 111 / 512 |
| 0.25 | 0.375 | 149 / 512 | 111 / 512 |
| 0.375 | 0.5 | 122 / 512 | 91 / 512 |
| 0.5 | 0.625 | 96 / 512 | 72 / 512 |
| 0.625 | 0.75 | 55 / 512 | 41 / 512 |
| 0.75 | 0.875 | 23 / 512 | 17 / 512 |
| 0.875 | 1.0 | 0 | 0 |

FIG. 10

SIGMA-DELTA MODULATOR WITH REDUCED SWITCHING RATE FOR USE IN CLASS-D AMPLIFICATION

PRIORITY INFORMATION

This application claims priority from provisional application Ser. No. 60/472,183 filed May 21, 2003 and Ser. No. 60/477,067 filed Jun. 9, 2003, both of which are incorporated herein by reference in their entireties.

BACKGROUND OF THE INVENTION

The invention relates to the field of sigma delta modulators, and in particular to a sigma delta generator providing hysteresis control to control the transition rate of the modulator.

Audio power amplifiers of conventional design suffer from low efficiency (often <50%), and this causes these designs to generate heat that must be removed by large heat sinks, causing the physical amplifier designs to be quite large. In recent years, in order to make amplifiers that are smaller, high-efficiency designs have been introduced. The most common approach is to use "Class-D" switching amplifiers. These amplifiers work by converting the analog input signal into a 2-level output signal using a high-frequency modulation process. This 2-level signal is then fed to a power stage, which in turn feeds a passive LC filter connected to the speaker. The power stage is fed from a V+ and V− supply, and outputs the V+ voltage when the input is a "1" and the V− voltage when the input is a "0". Since the output devices used in the power stage have no voltage across them while current is flowing, the heat produced by these devices is dramatically reduced.

Most prior-art systems employ a pulse-width modulation scheme, where the value of the input signal at a moment in time is represented by a fixed-voltage variable-width output pulse (PWM). A typical audio PWM amplifier can work at a switching frequency of between 100 KHz and 500 KHz. Higher switching frequencies will reduce distortion but also result in lower efficiency due to the extra transitions in the output waveform. Each transition takes a certain amount of energy to charge all the various node capacitances, and therefore reduces efficiency.

For typical clock rates of about 300 KHz, the distortion/noise performance of traditional class-D amplifiers is not very good.

Another modulation technique, which is less common, is to use a sigma-delta modulator that converts the analog input to a series of 1's and 0's at a higher sampling rate, typically about 64 times higher than the highest audio frequency. Such circuits are commonly used in A/D converter designs used for converting analog audio signals into a digital 1-bit stream. This technique yields better distortion characteristics than the PWM scheme, but the drawback is a significantly higher switching rate, resulting in lower efficiency.

The present invention uses the best features of both PWM (which has the lowest switching rate) and sigma-delta (which has the lowest distortion/noise).

SUMMARY OF THE INVENTION

According to one aspect of the invention, there is provided a sigma delta modulator. The sigma delta modulator includes a modulator module that includes a quantizer with variable hysteresis, which receives an input signal to perform necessary modulation operations. A non-linear mapping module receives a signal associated with the input signal and tabulates the necessary hysteresis control information so as to reduce the transition rate of the modulator module.

According to another aspect of the invention, there is provided a method of sigma delta modulation. The method includes providing a modulator module that includes a quantizer with variable hysteresis, which receives an input signal to perform necessary modulation operations. Furthermore, the method includes utilizing a non-linear mapping module that receives a signal associated with the input signal and tabulates the necessary hysteresis control information so as to reduce the transition rate of the modulator module.

BRIEF DESCRIPTION OF THE DRAWINGS

FIG. 6 is a table showing typical coefficient values for the system of FIG. 5.

FIG. 7 is a table demonstrating the hysteresis lookup table values for the system of FIG. 5;

FIG. 10 is a table demonstrating a modified lookup table with values for dither=0 and dither=1;

DETAILED DESCRIPTION OF THE INVENTION

Figure 1:
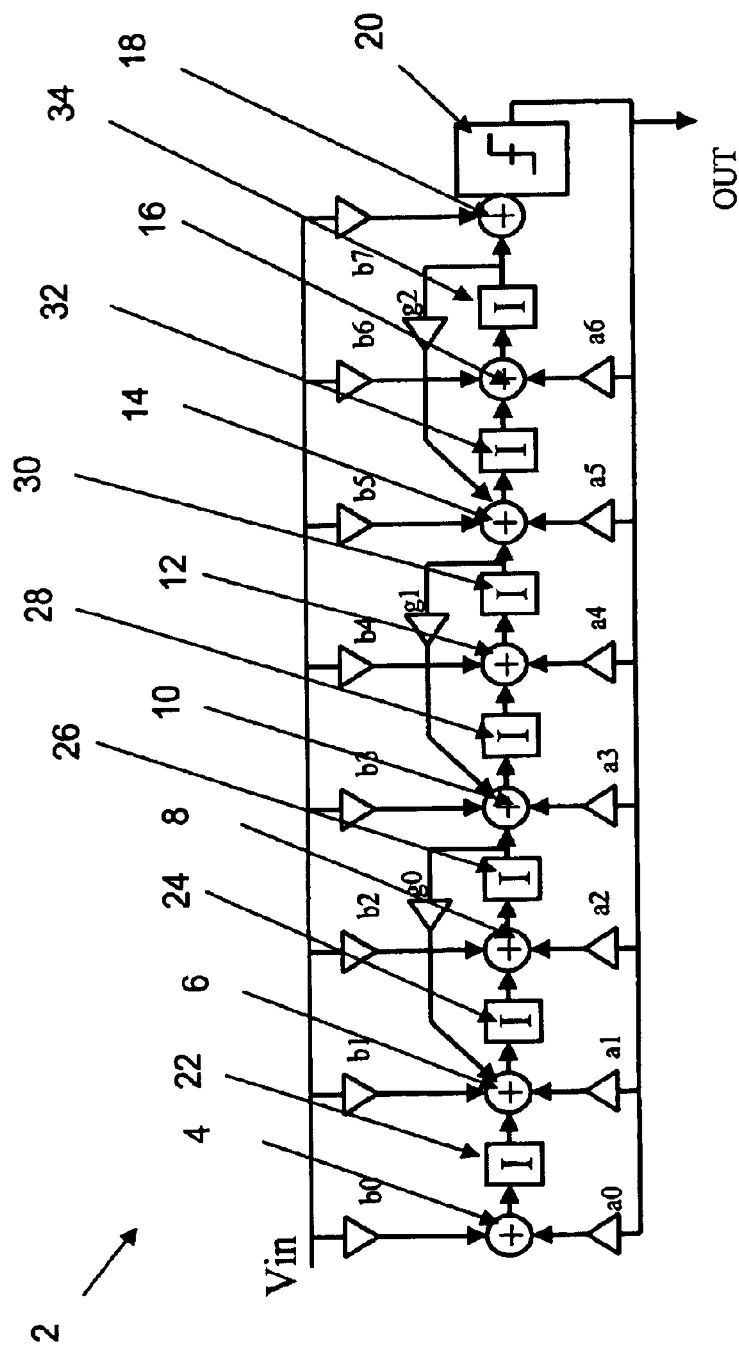
FIG. 1 is a schematic diagram demonstrating a high-order sigma-delta modulator topology.

FIG. 1 shows a sigma-delta architecture. This architecture can be implemented either with analog circuits (for a system with an analog input and a 1-bit digital output), digital circuits (for a system with a multi-bit digital input and a 1-bit digital output) or a mix, where the early stages of integration may be done using analog circuits, and later stages are done using digital circuits. This architecture produces a 1-bit output at a clock rate that is significantly higher than the highest frequency contained in the input signal (for example, 256*Fs, where Fs=48 Khz for audio applications), and the feedback action of the loop will heavily suppress the quantization noise introduced by the 1-bit quantization, such that the SNR over a limited frequency band (usually the audio band from 20–20 KHz) is very high.

The sigma delta modulator 2 can be built in a variety of ways. For analog-input systems, the integrators 22–34 are typically analog integrators, which can be implemented using either switched-capacitor techniques or standard analog linear techniques. For digital-input systems, the integrators are by necessity discrete-time integrators, implemented with standard digital hardware such as adders and registers.

The sigma delta modulator 2 includes integrators 22–34, summation modules 4–16, amplifiers b0–b7, amplifiers a0–a6, amplifiers g0–g3, and a comparator 20. The system outputs a signal $V_{out}$. The amplifiers b0–b7 amplify the input voltage $V_{IN}$ with their respective amplification factor and provide their outputs to their respective summation modules 4–16. The amplifiers a0–a6 amplify the output voltage $V_{out}$ with their respective amplification factor and provides its output to their respective summation modules 4–16. Selective summation modules 6, 10, 14 receive an input signal from amplifers g0–g3. The amplifiers g0–g3 amplifies the output of the selective integrators 26, 30, 34 with their respective amplification factor and provides their output to the selective summation modules 6, 10, 14.

If a discrete-time topology is chosen, each integrator I is defined by the equation $$V_0(n)=V_0(n-1)+V_{in}(n) \quad \text{Eq. 1}$$

where $V_0$(n) is the output voltage at time-step n, $V_0$(n−1) is the output voltage at time step n−1, and $V_{in}$(n) is the input voltage at time-step n. If a continuous-time topology is chosen (only relevant for analog-input systems), each integrator is defined by the integral of its' input voltage or current. Note that it has become common to find analog-input systems where some integrators are discrete-time (switched-capacitor), and others are continuous-time.

Since there are seven integrators, this is a $7^{th}$-order design. Such designs are well-known and there are several books that detail the design equations necessary to make such a system stable.

During the design of such loops, there is a tradeoff between stability and quantization noise suppression. The transfer function from the quantization noise input to the output is usually defined to be some classical high-pass filter function such as a Chebychev design. It is well known that there are some restrictions on the choice of filter design functions. These restrictions are a result of fundamental causality constraints that exist in any feedback system.

Figure 2:
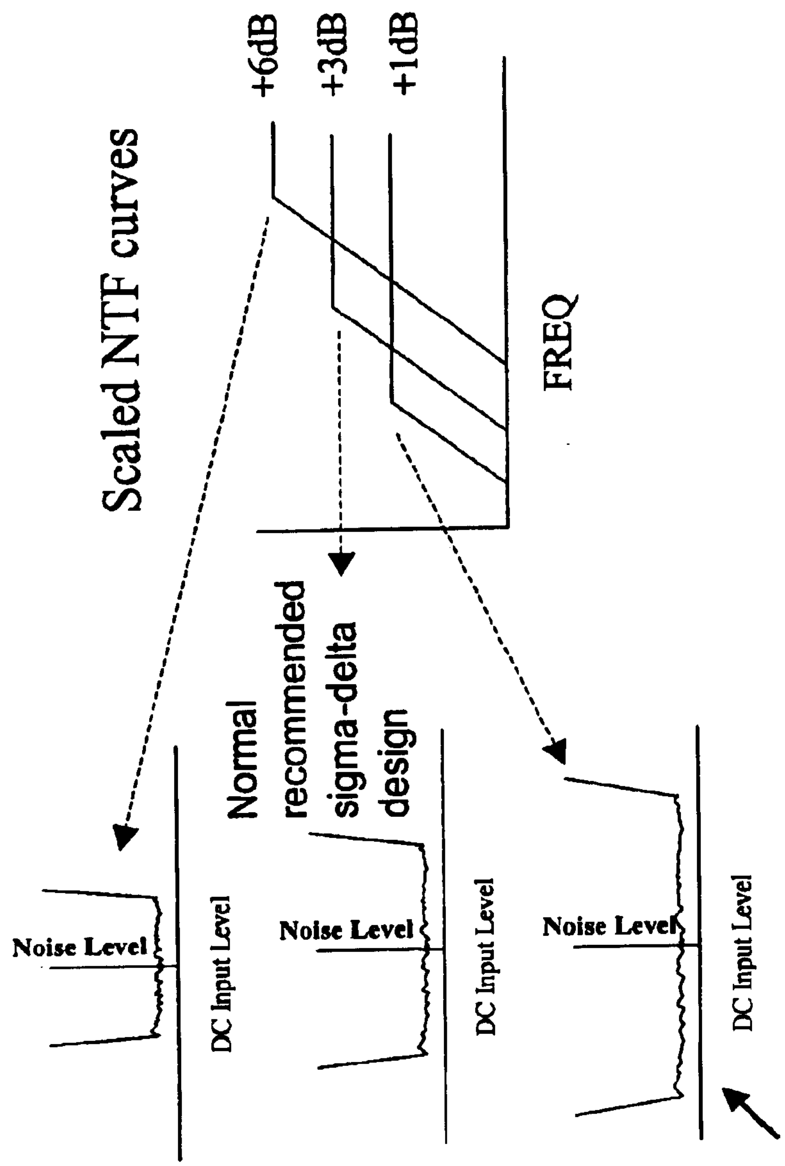
FIG. 2 shows graphs demonstrating the relationship between possible noise-shaping transfer-function curves (NTF) and maximum stable input range.

FIG. 2 shows how these restrictions affect stability. The frequency-response graph, as shown in FIG. 2, represents the transfer function from the error introduced into the loop by the quantizer (typically a comparator) to the output Vout. The highpass characteristic is determined by the order of the loop and the coefficients used in the loop; clearly, as the highpass response is moved out to higher frequencies, the magnitude of the noise that affects the low-frequency audio band is dramatically reduced. However, it is not possible to make the cutoff frequency of this filter too high. As the cutoff frequency of the high-pass filter is increased, the high-frequency gain of the filter must be increased in order for the loop to be causal. This increase in high-frequency gain causes the loop to be less stable. FIG. 2 shows several plots of SNR as a function of the DC input level. When the DC input level reaches some critical value, the SNR drops dramatically, indicating that the loop has become unstable.

The relationship between quantization noise suppression and stability can be stated as follows; loops with aggressive noise-suppression transfer functions become unstable at lower input levels, while loops with less-aggressive noise-suppression transfer functions are stable over larger input ranges. Typically, a compromise is used such that the modulator is stable for inputs up to about 70% of the full theoretic input range.

One drawback of using a sigma-delta modulator as a class-D modulator is that the transition rate is quite high, resulting in switching losses in the power stage that reduce efficiency. For example, the loop 2 shown in FIG. 1 operates at a clock rate of 256 times the normal audio sample rate of 48 KHz, or about 12 MHz. In the worst case, there could be a transition on every clock cycle, although the actual number is typically about ½ of this value. By contrast, most PWM systems operate at a frequency of about 350 KHz. In a PWM system, there is always an "up" and "down" transition during every 350 KHz clock period, resulting in a transition rate of 700K transitions/sec. Therefore, the sigma-delta system may have a transition rate that is 10 times higher than a typical PWM system.

The invention uses hysteresis to reduce the transition rate of the loop shown in FIG. 1. A 1-bit quantizer (comparator) with hysteresis can be defined as follows;

Variable definitions;

$V_{comp}$(n)—new comparator output $V_{comp}$(n−1)—old comparator output $V_{cin}$(n)—new comparator input voltage H—hysteresis factor having the following equation $$\begin{aligned} &\text{If}(V_{cin}(n) > -H^{*}\ V_{comp}(n-1)\ \{ \\ &\quad V_{comp}(n) = +1; \\ &\quad \}\ \text{else}\ \{ \\ &\quad V_{comp}(n) = -1\}. \end{aligned} \quad \text{Eq. 2}$$

When such a quantizer is inserted into the loop or system 2 of FIG. 1, the transition rate of the loop 2 is reduced. This can be explained as follows. Every time the quantizer changes state, the threshold of the quantizer is changed in such a way that the loop filter 20 output voltage must change by a larger amount (compared to the no-hysteresis case) in order to cross the new threshold. For example, if the quantizer output were −1 and the loop filter 20 output (quantizer input) was −0.5 volts, and Q=0.5, then the threshold of the comparator would be +0.5 volts. The loop filter 20 output would therefore have to change from −0.5 volts to +0.5 volts in order to change the state of the quantizer. Since the loop filter 20 is a chain of integrators, it can take many cycles for the loop filter 20 output to change from −0.5 volts to +0.5 volts. During this time, there are no transitions in the output. This causes the average output transition rate to be lowered.

The stability of a high-order modulator is reduced by the introduction of quantizer hysteresis. This is not surprising, since the "ideal" quantizer decision is changed quite often by the hysteresis feedback. It is therefore necessary to start with a highly stable design so that hysteresis can be tolerated. For example, curve "C" in FIG. 2 has a large stable range due to the small amount of high-frequency NTF (noise-shaping transfer-function) gain. This curve would typically be considered too conservative for a design with no hysteresis, but it works well for the case where hysteresis is needed to reduce the transition rate.

Figure 3:
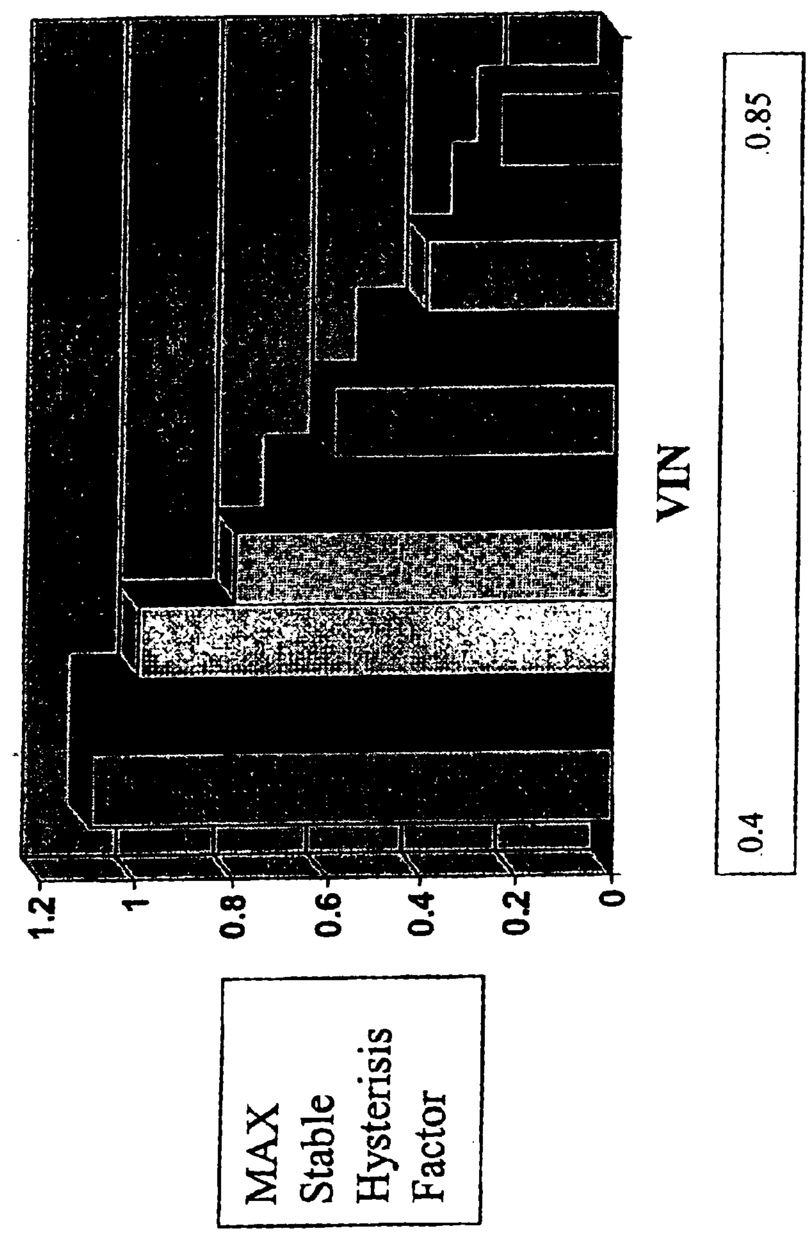
FIG. 3 is a graph demonstrating the maximum stable hysteresis factor as a function of the DC input level.

FIG. 3 shows the relationship between the maximum stable input range and the amount of hysteresis used. For small DC inputs, the maximum hysteresis is quite large (>1). For large DC inputs, the maximum amount of hysteresis becomes smaller (about 0.2). This graph is the result of a C-code simulation of the system in FIG. 1.

Figure 4:
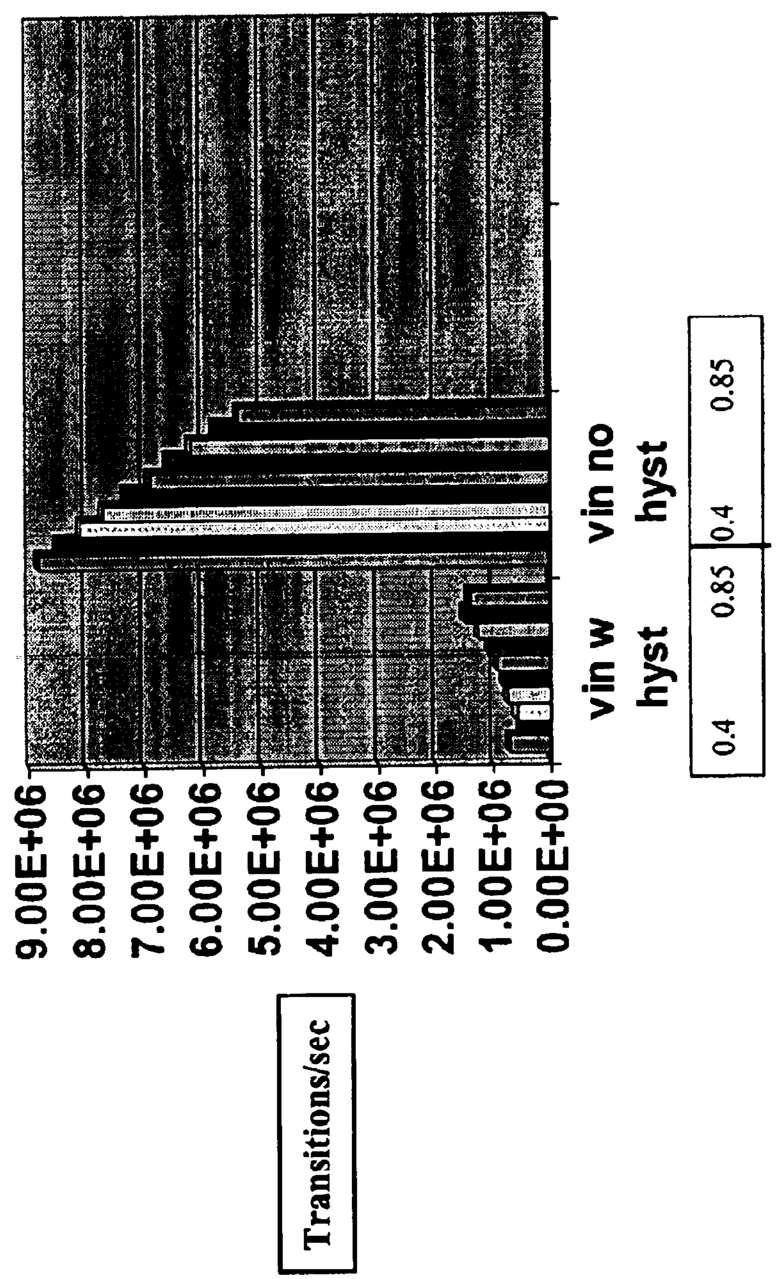
FIG. 4 is a graph demonstrating the comparison of transition rates with and without hysteresis, as a function of the input level.

FIG. 4 shows how the transition rate is affected by hysteresis. For the case without hysteresis, the transition rate starts at about 9 million transitions/sec for small inputs, and reduces to about 5 million transitions/sec with large inputs. For the case with hysteresis, the transition rate starts at about 600K transitions/sec for small inputs, and increases to about 1.1 million transitions/sec for large inputs. Note that for the simulations with hysteresis, the amount of hysteresis was set to the maximum value that results in a stable system for each particular input level. The drop in transition rate is very dramatic, and produces an average rate that is very similar to a typical PWM system, but with much better performance.

Figure 5:
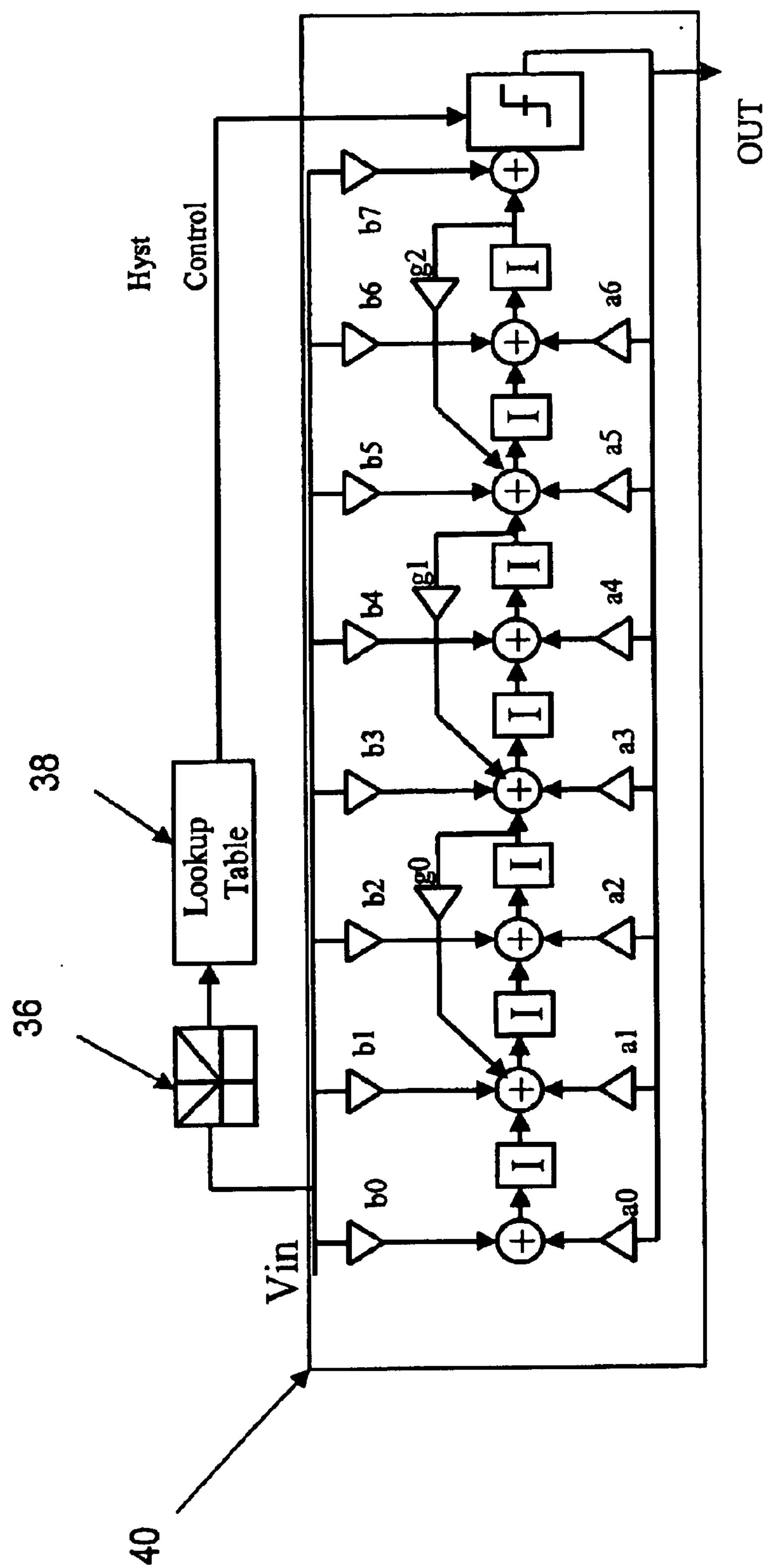
FIG. 5 is a schematic diagram demonstrating a digital system with signal-adaptive hysteresis.

The relationship between hysteresis level, transition rate, and stable input range shown in FIGS. 3 and 4 imply that there is no single value of hysteresis that is optimal for all input levels. To overcome this problem, the invention uses a variable amount of hysteresis. The inventive system (all-digital implementation) is shown in FIG. 5. The input signal $V_{in}$ is applied to both the modulator 40 as well as an absolute-value circuit 36. The output of the absolute-value circuit 36 then feeds a lookup table 38. The lookup table 38 holds the optimum values of the hysteresis factor H for every given input range. The preferred embodiment uses an 8-value lookup table. FIGS. 6 and 7 show the coefficient values and lookup table values used for optimum performance. Note the modulator system 40 of FIG. 5 uses a similar modulator arrangement as described in FIG. 1.

Figure 8:
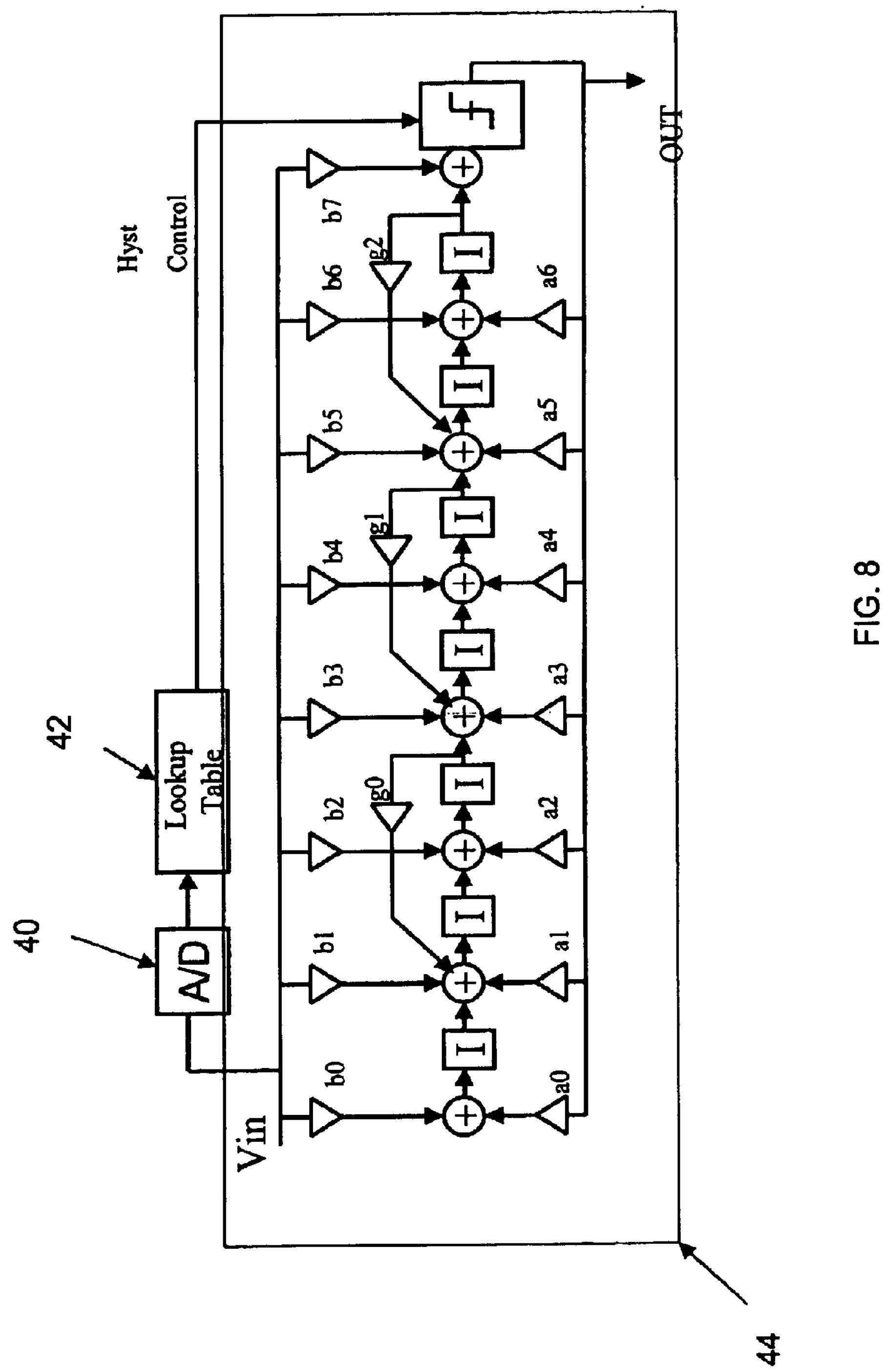
FIG. 8 is a schematic diagram demonstrating an analog system with adaptive hysteresis.

FIG. 8 shows the analog implementation of the invention. A small low-resolution A/D converter 40 (typically only 3 to 5 bits) is required on the input to generate the required digital input to the lookup table 42. Note that the absolute value function could either be performed in the analog domain before the A/D converter 40, or more likely by adding an extra bit to the A/D converter 40, and extending the lookup table 42 by one extra bit so that negative inputs give the same result at the output of the lookup table as do positive inputs. Note the modulator system 44 is similar to the system described in FIG. 1.

Note that while the system shown uses the input signal to alter the quantizer hysteresis level, it is also possible to control the hysteresis from some other internal signal. For example, it is possible to use past values of the 1-bit output, and use these past bits to set the hysteresis level. It can also be possible to use some internal signals in the loop filter to set the hysteresis.

Figure 9:
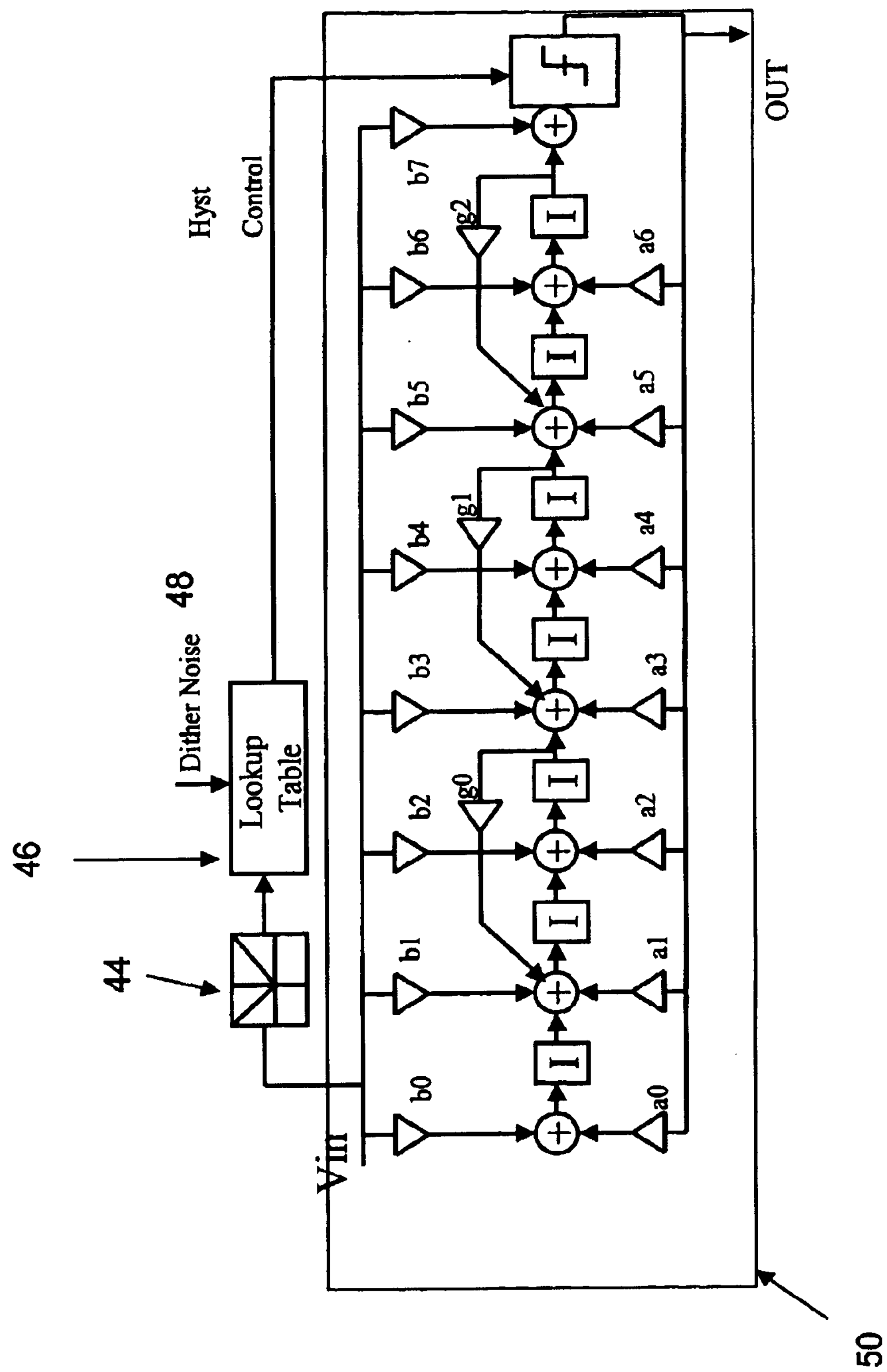
FIG. 9 is a schematic diagram demonstrating a system with dither added to lookup table.

One common problem with class-D amplifiers is electromagnetic interference (EMI). Often these modulators have a strong spectral component at frequencies above 100 KHz that can cause interference with radios and other devices. In this invention, a random 1-bit sequence can be used to spread out any strong line spectra that exist at high frequencies. One place to add this signal is in the lookup table. The 1-bit random signal can be used to slightly alter the values contained in the lookup table. Since the hysteresis has a direct effect on the "idling" frequency of the loop, this causes the idling frequency to become spread out in the frequency domain, which reduces the amplitude of the highest spectral peak quite substantially. The resulting system is shown in FIG. 9, and the modified table entries are shown in FIG. 10. The system includes the absolute value function circuit 44, modulator system 50, and lookup table 46. Note the modulator system 44 is similar to the system described in FIG. 1. The dither signal 48 would normally be clocked at a lower rate than the rest of the modulator 50 to avoid causing rapid changes in the hysteresis level that might cause the transition rate to increase. Note the modulator system 50 is similar to the system described in FIG. 1.

To get optimally low output transition rate and high output, different amounts of hysteresis should be used, depending on input signal level.

The goal of the scheme is to reduce modulator output transition rate as much as possible, without causing modulator instability or other significant performance degradations. Adding hysteresis to the quantizing comparator reduces output transition rate, but interferes with 'normal' modulator operation, and makes it less stable.

Another influence on modulator stability is the input signal level. Generally speaking, a high order sigma delta modulator is more stable for small inputs, and less stable for large ones.

So for X input signal level, up to Y amount of quantizer hysteresis may be safe, and actual use of an amount near Y provides greatest decrease in output transition rate. But for input>X, Y hysteresis may be too much, and instead Z<Y is the maximum safe amount.

Figure 11:
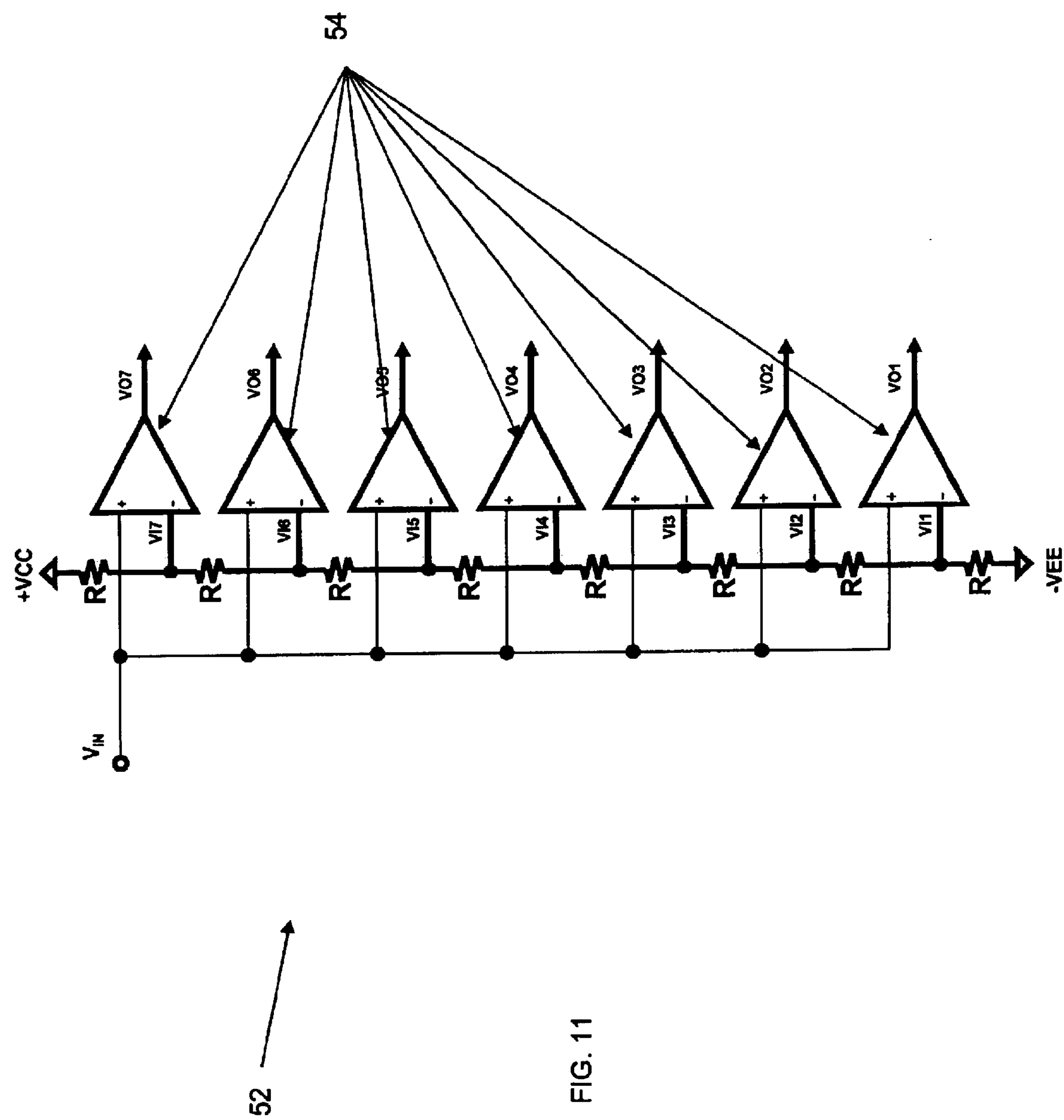
FIG. 11 is a schematic diagram demonstrating a first structure for monitoring $V_{IN}$ with Flash ADC.

A first structure 52 is provided for measuring a modulator input level. For a modulator with analog input, a simple 'FLASH' analog-to-digital converter (ADC) might be used, as shown in FIG. 11. Here, it's assumed that input signal $V_{IN}$ varies between a minimum of $-V_{EE}$ and max of $+V_{EE}$. This voltage range is divided (quantized) into eight smaller sub-ranges, or quantization levels, as shown in Table 1.

TABLE 1

| Quantization level | Definition |
|---|---|
| +3.5 | VI7 < V < +VCC |
| +2.5 | VI6 < V < VI7 |
| +1.5 | VI5 < V < VI6 |
| +0.5 | VI4 < V < VI5 |
| −0.5 | VI3 < V < VI4 |
| −1.5 | VI2 < V < VI3 |
| −2.5 | VI1 < V < VI2 |
| −3.5 | −VEE < V < VI1 |

The seven comparators 54 determine the quantization level within which $V_{IN}$ resides. Note the resistors string R are connected to the negative ports of the comparators. These resistors 4 provide a unique reference level to every comparator to set the comparator switching point to the proper voltage. The $V_{IN}$ information is then used to select a hysteresis level for the modulator's quantizer. In this example, comparators 54 are required to distinguish between eight levels. Mathematically, one might think of the levels as ranging between −3.5 and +3.5, as shown in the table. However, we could also use an integer from 1 to 8 to represent them. The integer representation simplifies the design of logic which uses the ADC output.

More generally, N−1 comparators are necessary to distinguish between N levels, in a FLASH ADC. This relationship can cause a problem. Suppose a large N is required so that the hysteresis level in the modulator may be controlled with a high degree of precision. The (N−1) comparators needed to support this are a lot of circuitry, which may consume excessive power, or occupy excessive area if implemented on an IC. It would be better if the number of required comparators were independent of N, and small.

There are ADC architectures such as successive-approximation (SAR) ADCs, which achieve very high resolution with a small number of comparators. However, they require a succession of clock cycles to complete their calculations. Such a delay is unacceptable here, because by the time a hysteresis level is chosen for the quantizer, the modulator input may have changed significantly, so that the selected hysteresis is inappropriate.

A SAR ADC might still work if its clock were much faster than the modulator clock, but there is a simpler alternative.

Figure 12:
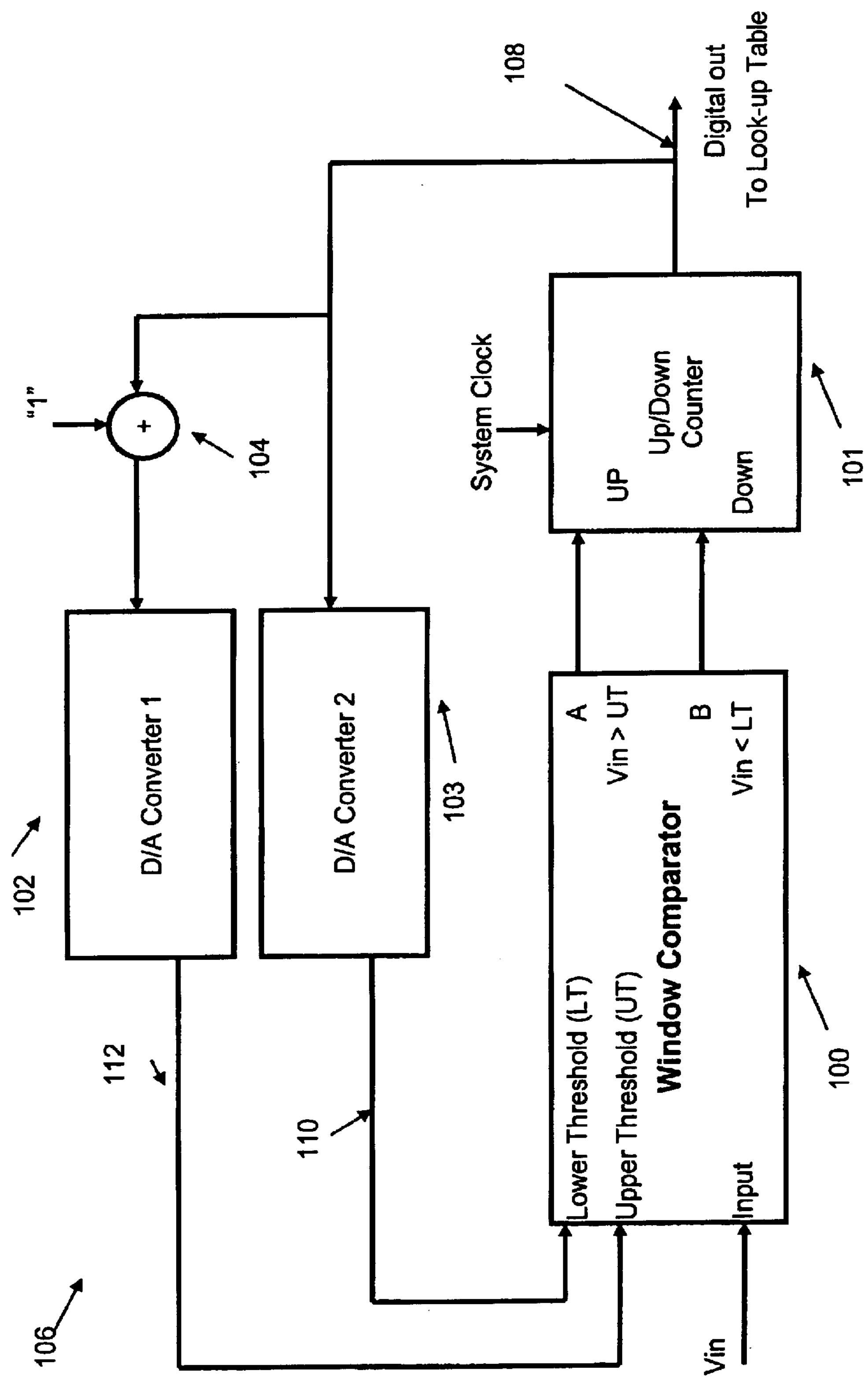
FIG. 12 is a schematic diagram illustrating the conceptual form of a technique that reduces the number of comparators for a given number of quantization levels.

FIG. 12 shows the conceptual form of a technique that reduces the number of comparators for a given number of quantization levels. The window comparator 100 has three inputs; an upper threshold (UT), a lower threshold (LT), and a voltage input $V_{in}$. The window comparator 100 has two outputs; output "A", which is logic HI if the input is greater than the upper threshold (UT), and output "B", which is logic HI if the input is less than the lower threshold (LT).

Up/Down Counter 101 is an N-level counter which increments UP by one whenever the "A" output of the window comparator 102 is logic HIGH, and increments DOWN by one whenever the "B" output of the window comparator block 100 is logic HIGH.

D/A converter 103 receives the output 108 of up/down counter 101 and provides an analog output 110 connected to the lower threshold (LT) input of the window comparator 100. D/A converter 102 receives the output 108 of up/down counter 101 through adder 104, which adds the constant "1", and provides an analog output 112 connected to the upper threshold (UT) input of the window comparator 100. The two D/A converters 102, 103 are designed with a quantization step size of $V_{delta}$, where $V_{delta}$ is the desired quantization step-size of the A/D function provided by this circuit.

In operation, if the input to the window comparator 100 is constant, the feedback loop 106 will adjust the D/A converter outputs 110, 112 (and, by connection, the upper/lower threshold of the window comparator 100) until the input $V_{in}$ is between the upper and lower threshold of the window comparator 100. If the input $V_{in}$ is increased in a positive manner so that it exceeds the upper threshold (UT), the up-down counter 101 is incremented by 1, which causes the digital output to increase and also causes the two D/A converter output voltages 110, 112 to increase by one quantization level. This increase sets the two window-comparator levels such that the input $V_{in}$ is once again between the upper (UT) and lower threshold (LT). If the input $V_{in}$ is decreased so that it falls below the lower threshold (LT), the up-down counter 101 is decremented by 1, which causes the digital output 108 to decrease and the two D/A converter output voltages 110, 112 to decrease by one quantization level. This decrease sets the two window-comparator levels such that the input $V_{in}$ is once again between the upper (UT) and lower threshold (LT).

The digital output 108 thus represents the input with a resolution of $V_{delta}$, and the number of quantization levels is only limited by the number of bits in the D/A converter 102, 103 and up/down counter 101. The only limitation of this technique is that if the input changes by more than $V_{delta}$, the up/down counter 101 may take several cycles of the system clock before equilibrium is reached.

Figure 13:
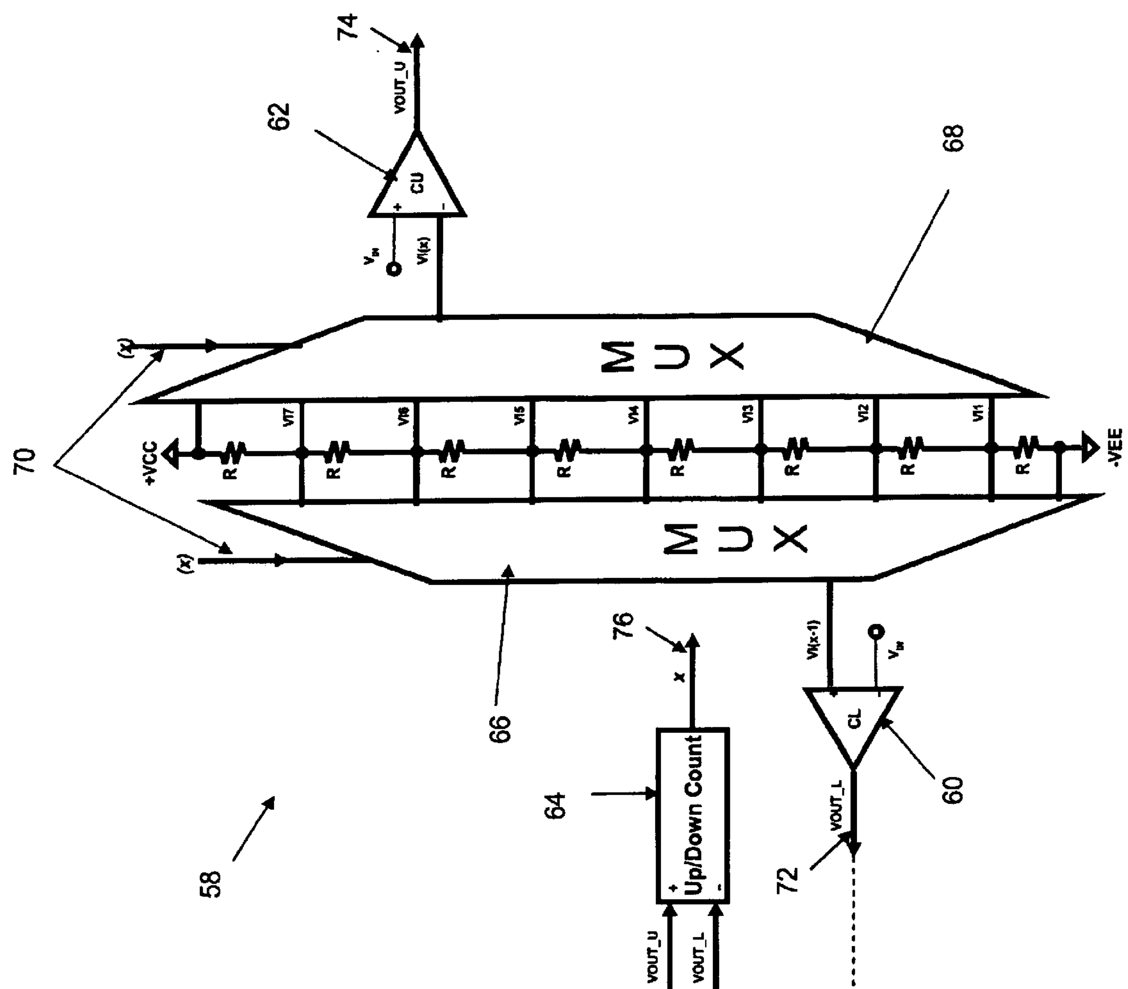
FIG. 13 is a schematic diagram demonstrating a hardware implementation of the technique shown in FIG. 12.

FIG. 13 shows a structure 58 having a hardware implementation of the technique discussed in FIG. 12. The two D/A converters 102, 103 of FIG. 12 are implemented using a two analog MUX selectors 66 and 68 that select a particular tap from a resistor string R that generates linearly-spaced reference voltages. By wiring the two muxes 66, 68 offset from one another, the two D/A converters 102, 103 of FIG. 12 can be implemented in one simple structure 58 without the need for a digital adder. That is, given the same code digital code x applied to both Muxes 66, 68 in FIG. 13, two voltages are generated simultaneously that are offset by the desired quantization size $V_{delta}$.

The window comparator 100 of FIG. 12 is implemented in FIG. 13 with two comparators 60 and 62. These comparators 60, 62 are fed from both the input $V_{in}$ as well as the output 72 or 74 of the appropriate Mux 66 or 68.

Up/Down Counter 64 is of conventional design and is well known to those skilled in the art.

Table 2 shows the detailed operation of the circuit 58. The lower threshold voltage (LT) is designated as VI(x−1) and the upper threshold voltage (UT) as VI(X), where x represents the digital input to the MUXes 66, 68, which select the appropriate resistor tap. Note x(t) also designates the output of the up/down counter 64, which forms the digital output 76 of the circuit 58 at time t.

TABLE 2

| VIN | Action |
|---|---|
| VIN > VI(x) | x(t) < N: x(t + 1) = x(t) + 1 (increment)<br>x(t) = N: x(t + 1) = x(t) (saturate high) |
| VI(x − 1) < VIN < VI(x) | x(t + 1) = x(t) (unchanged) |
| VI(x − 1) < VIN | x(t) > 1: x(t + 1) = x(t) − 1 (decrement)<br>x(t) = 1: x(t + 1) = x(t) (saturate low). |

As the table indicates, some 'saturation' logic limits signal x to between 1 and N.

Here is an example, to show how the structure 52 of FIG. 11 compares to the structure 58 of FIG. 13. Assume signal x is initialized to 5 at t=0 in both schemes, as shown in Table 3.

TABLE 3

| Time index t | t = 1, | t = 2, | t = 3, | t = 4, | t = 5, | t = 6, | t = 7, | t = 8 |
|---|---|---|---|---|---|---|---|---|
| Sequence of actual VIN(t)'s, quantized to 1 of 8 levels | 2.5, | 3.5, | 2.5, | 2.5, | 1.5, | −2.5, | −1.5, | −0.5 |
| Sequence of x(t + 1)'s, for method 1 | 7, | 8, | 7, | 7, | 6, | 2, | 3, | 4 |
| Sequence of x(t + 1)'s, for method 2 | 6, | 7, | 7, | 7, | 6, | 5, | 4, | 4 |

The outputs of the second structure 58 sometimes 'lag' behind those of the first structure 52, if $V_{IN}$ is changing quickly. Therefore, second structure 58 works best if $V_{IN}$ changes slowly during the modulator clock period. If $V_{IN}$ changes by no more than one quantization level per modulator clock period, the second structure 58 can 'keep up' and works the same as the first structure 52.

Even if $V_{IN}$ occasionally changes by more than one level per clock period, x generally moves in the right direction in the second structure 58, and quickly 'catches up.' This is good enough for many modulators, because they're not so sensitive to an inappropriate hysteresis level that they go unstable after just one period of improper hysteresis. Instead, instability only results from many periods of inappropriate hysteresis. The second structure 58 avoids this for sufficiently bandlimited $V_{IN}$.

In the second structure, it might seem as if complexity is similar to the first structure. (N−3) comparators are eliminated in the second structure, but add the logic of the MUXes 66, 68 and register 64. On many ICs, however, the MUXes 66, 68 and register 64 occupy less area than do comparators, and consume less power. Also, even though it isn't shown, some form of a register is often needed in the first structure 52, as shown in FIG. 11, to ensure that control signals to select the hysteresis change only at appropriate times. In this case, a register is needed in both structures 52, 58, and the true hardware tradeoff is extra comparators 54 in first structure 52 vs. MUXes 66, 68 in the second structure 58.

For clarity in this discussion, it's been assumed that the modulator input signal is readily available, and appropriate to use in selecting an appropriate hysteresis amount.

However, there are a number of modulator architectures in which this may not be true. There may be a good alternative 'hysteresis-selector,' though, in which case the arguments applied here to the modulator input signal can instead be applied to the alternative.

Also for clarity, the second structure 58 has been described as using exactly two comparators 60, 62. However, it could be extended to use more than two comparators but less than (N−1).

Although the present invention has been shown and described with respect to several preferred embodiments thereof, various changes, omissions and additions to the form and detail thereof, may be made therein, without departing from the spirit and scope of the invention.

What is claimed is:

1. A sigma delta modulator comprising:

a modulator module including a quantizer with variable hysteresis that receives an input signal to perform necessary modulation operations; and a non-linear mapping module that receives a signal associated with said input signal and tabulates the necessary hysteresis control information so as to reduce the transition rate of said modulator module.

2. The sigma delta modulator of claim 1, wherein said modulator module comprises digital components.

3. The sigma delta modulator of claim 1, wherein said modulator module comprises analog components.

4. The sigma delta modulator of claim 1, wherein said modulator module comprises an arrangement of a plurality of analog integrators, a plurality of analog gain scaling operations, and a quantizer with variable hysteresis.

5. The sigma delta modulator of claim 1, wherein said modulator module comprises an arrangement of a plurality of digital integrators, a plurality of digital gain scaling operations, and a quantizer with variable hysteresis.

6. The sigma delta modulator of claim 1 further comprising an absolute value circuit that receive said input signal and performs an absolute value function on input said signal and provides its output to said non-linear mapping module.

7. The sigma delta modulator of claim 1 further comprising an analog-to-digital converter (ADC) module that receives said input signal and forms a plurality of quantization levels that are provided to said non-linear mapping module.

8. The sigma delta modulator of claim 7, said ADC module comprises a FLASH ADC.

9. The sigma delta modulator of claim 7, wherein the ADC comprises a window comparator with upper and lower threshold voltages derived from two digital-to-analog converters (DACs), respectively, wherein each DAC is adjusted according to previous ADC digital outputs.

10. The sigma delta modulator of claim 9, wherein said two DACs are adjusted by an up/down counter connected to the output of said window comparator.

11. The sigma delta modulator of claim 9, wherein said two DACs comprise of a single resistor string producing fixed reference voltages, with two separate analog MUX circuits providing two independent DAC outputs from the same resistor string.

12. The sigma delta modulator of claim 11, wherein each of said analog MUX receives the same digital control signal, and the generation of said upper and lower thresholds is done by connecting one MUX to the resistor string with an offset of one resistor tap compared to the other MUX.

13. A method of sigma delta modulation comprising:

providing a modulator module including a quantizer with variable hysteresis that receives an input signal to perform necessary modulation operations; and utilizing a non-linear mapping module that receives a signal associated with said input signal and tabulates the necessary hysteresis control information so as to reduce the transition rate of said modulator module.

14. The method of claim 13, wherein said modulator module comprises digital components.

15. The method of claim 13, wherein said modulator module comprises analog components.

16. The method of claim 13, wherein said modulator module comprises an arrangement of a plurality of analog integrators, a plurality of analog gain scaling operations, and a quantizer with variable hysteresis.

17. The method of claim 13, wherein said modulator module comprises an arrangement of a plurality of digital integrators, a plurality of digital gain scaling operations, and a quantizer with variable hysteresis.

18. The method of claim 13 further comprising providing an absolute value circuit that receive said input signal and performs an absolute value function on input said signal and provides its output said non-linear mapping module.

19. The method of claim 13 further comprising providing an analog-to-digital converter (ADC) module that receives said input signal and forms a plurality of quantization levels that are provided to said non-linear mapping module.

20. The method of claim 19, said ADC module comprises a FLASH ADC.

21. The method of claim 19, wherein the ADC comprises a window comparator with upper and lower threshold voltages derived from two DACs, respectively, wherein each DAC is adjusted according to previous ADC digital outputs.

22. The method of claim 21, wherein the two DACs are adjusted by an up/down counter connected to the output of said window comparator.

23. The method of claim 21, wherein the two DACs are comprised of a single resistor string producing fixed reference voltages, with two separate analog MUX circuits providing two independent DAC outputs from the same resistor string.

24. The method of claim 23, wherein each analog MUX receives the same digital control signal, and the generation of said upper and lower thresholds is done by connecting one MUX to the resistor string with a offset of one resistor tap compared to the other MUX.

* * * * *